(12) United States Patent
Lee et al.

(10) Patent No.: US 12,426,486 B2
(45) Date of Patent: Sep. 23, 2025

(54) DISPLAY PANEL FOR UNDER DISPLAY CAMERA AND ELECTRONIC DEVICE INCLUDING THE SAME

(71) Applicant: SAMSUNG ELECTRONICS CO., LTD., Suwon-si (KR)

(72) Inventors: Kihyuk Lee, Suwon-si (KR); Jeongho Cho, Suwon-si (KR); Jongah Kim, Suwon-si (KR); Heewoong Yoon, Suwon-si (KR); Donghan Lee, Suwon-si (KR); Gwangho Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 460 days.

(21) Appl. No.: 18/090,914

(22) Filed: Dec. 29, 2022

(65) Prior Publication Data

US 2023/0217793 A1 Jul. 6, 2023

Related U.S. Application Data

(63) Continuation of application No. PCT/KR2022/019800, filed on Dec. 7, 2022.

(30) Foreign Application Priority Data

Dec. 30, 2021 (KR) .................. 10-2021-0193044

(51) Int. Cl.
*H10K 59/35* (2023.01)
*H10K 59/80* (2023.01)

(52) U.S. Cl.
CPC ......... *H10K 59/8792* (2023.02); *H10K 59/35* (2023.02)

(58) Field of Classification Search
CPC .................. H10K 59/8792; H10K 59/35
(Continued)

(56) References Cited

U.S. PATENT DOCUMENTS

2008/0165292 A1 7/2008 Bing et al.
2013/0242479 A1 9/2013 Yoo et al.
(Continued)

FOREIGN PATENT DOCUMENTS

CN 110489018 A 11/2019
CN 110518037 A 11/2019
(Continued)

OTHER PUBLICATIONS

International Search Report and Written Opinion (PCT/ISA/210, and PCT/ISA/237) dated Mar. 14, 2023, issued by International Searching Authority in International Application No. PCT/KR2022/019800.
(Continued)

*Primary Examiner* — Christopher M Raabe
(74) *Attorney, Agent, or Firm* — Sughrue Mion, PLLC

(57) ABSTRACT

An electronic device may include a housing, a display panel including a plurality of color pixels and a black matrix provided between the plurality of color pixels, and a photosensor provided between the housing and the display panel, wherein the display panel has a first region corresponding to the photosensor and a second region surrounding the first region, the black matrix has a first plurality of holes having a first density in the first region, and a second plurality of holes a second density in the second region, and the second density is higher than the first density.

20 Claims, 13 Drawing Sheets

(58) Field of Classification Search
USPC .......................................................... 313/506
See application file for complete search history.

(56) References Cited

U.S. PATENT DOCUMENTS

| | | |
|---|---|---|
| 2013/0250064 A1 | 9/2013 | Suh et al. |
| 2016/0223468 A1 | 8/2016 | Jung et al. |
| 2019/0172875 A1 | 6/2019 | Kang et al. |
| 2020/0127066 A1 | 4/2020 | Zhang et al. |
| 2020/0135972 A1 | 4/2020 | Ma et al. |
| 2021/0020664 A1 | 1/2021 | Tan |
| 2021/0065602 A1 | 3/2021 | Lee et al. |
| 2021/0074777 A1 | 3/2021 | Chen |
| 2021/0126066 A1 | 4/2021 | Hwang et al. |
| 2022/0271103 A1 | 8/2022 | Hai et al. |
| 2022/0302223 A1* | 9/2022 | Shi ....................... H10K 50/865 |

FOREIGN PATENT DOCUMENTS

| | | | |
|---|---|---|---|
| CN | 111739915 A | | 10/2020 |
| CN | 112861763 A | | 5/2021 |
| CN | 113791511 A | | 12/2021 |
| CN | 119828379 | * | 4/2025 |
| JP | 2009-130276 A | | 6/2009 |
| JP | 2016-57712 A | | 4/2016 |
| KR | 10-2008-0064324 A | | 7/2008 |
| KR | 10-2013-0105125 A | | 9/2013 |
| KR | 10-2013-0106629 A | | 9/2013 |
| KR | 10-2018-0102883 A | | 9/2018 |
| KR | 10-2019-0011280 A | | 2/2019 |
| KR | 10-2019-0066433 A | | 6/2019 |
| KR | 10-2021-0009368 A | | 1/2021 |
| KR | 10-2021-0032923 A | | 3/2021 |
| KR | 10-2021-0105782 A | | 8/2021 |
| WO | 2015/037917 A1 | | 3/2015 |

OTHER PUBLICATIONS

Extended European Search Report dated Jan. 24, 2025, issued by the European Patent Office in European Application No. 22916510.5.

* cited by examiner

DISPLAY PANEL FOR UNDER DISPLAY CAMERA AND ELECTRONIC DEVICE INCLUDING THE SAME

CROSS-REFERENCE TO RELATED APPLICATIONS

This application is a continuation of International Application No. PCT/KR2022/019800, filed Dec. 7, 2022, designating the United States, in the Korean Intellectual Property Receiving Office, and claiming priority to Korean Patent Application No. 10-2021-0193044, filed Dec. 30, 2021, in the Korean Intellectual Property Office, the disclosures of which are incorporated by reference herein in their entireties.

BACKGROUND

1. Field

The disclosure relates to a display panel for an under display camera (UDC) and an electronic device including the same.

2. Description of Related Art

Along with the remarkable development of information and communication technology and semiconductor technology, the proliferation and use of various electronic devices have been rapidly increasing. Particularly, recent electronic devices may conduct communication, while being carried, and include one or more sensors to obtain various types of information about surroundings. In an electronic device, sensors may obtain various types of information, and their types may be diversified according to information to be obtained.

Among the sensors of the electronic device, sensors using light may include a camera sensor, an ultra violet (UV) sensor, an iris sensor, a spectrometer, an infrared (IR) (proximity/gesture) sensor, a red, green, blue (RGB) sensor, and/or an illuminance sensor (or ambient light sensor (ALS)).

A photosensor may measure the amount of light in each wavelength band in red (R), green (G), blue (B), and C (clear) channels, and remove an infrared (IR) component included in visible light using the value (clear/the whole visible light band) of the C channel. The photosensor may identify the type (e.g., an incandescent lamp or a halogen lamp) of a light source according to the ratio of each channel, and measure the intensity (e.g., illuminance) of light through modeling according to the light source.

The photosensor is disposed under a display panel for aesthetics.

In a display panel for an under display camera (UDC), a black matrix is disposed in a space between color pixels. To secure the transmittance of the photosensor, the black matrix may need to be partially open.

SUMMARY

In this case, when light is transmitted through the open space, the light may be absorbed by the side surfaces of the open space, thereby reducing the amount of light and hence a field of view (FOV). The FOV may refer to an angle at which light is incident with about 50% of the intensity of light at an incident angle of 0 degrees.

Various embodiments of the disclosure may provide a display panel capable of improving an FOV, while securing visibility, when a UDC is used, and an electronic device including the same.

According to an aspect of the disclosure, an electronic device may include, a housing, a display panel including a plurality of color pixels and a black matrix provided between the plurality of color pixels, and a photosensor provided between the housing and the display panel, wherein the display panel has a first region corresponding to the photosensor and a second region surrounding the first region, the black matrix may have a first plurality of holes having a first density in the first region, and a second plurality of holes a second density in the second region, and the second density is higher than the first density.

The plurality of color pixels may include a plurality of green pixels, the first density may correspond to a number of the plurality of green pixels in the first region, and the first density may have a value between 0 and 1.

The first density may be 1/9.

The second density may correspond to a number of the plurality of green pixels in the second region, and the second density may have a value between 0 and 1.

The second density may be twice the first density.

The electronic device may further include a light blocking material provided on at least part of the first region of the display panel.

The light blocking material may include at least one of an opaque tape, a white print, or a color print.

The electronic device may further include a light blocking material provided on at least part of the photosensor.

The light blocking material may include at least one of an opaque tape, a white print, or a color print.

The display panel may have a display region surrounding the second region, and the black matrix does not have a hole in the display region.

A size of the first region and a size of the second region may be based on a size of the photosensor.

According to an aspect of the disclosure, an display panel may include a plurality of color pixels, and a black matrix provided between the plurality of color pixels, wherein the black matrix may have a first plurality of holes having a first density in a first region of the display panel corresponding to a photosensor, and a second plurality of holes having a second density higher than the first density in a second region of the display panel around the first region.

The plurality of color pixels may include a plurality of green pixels, the first density may correspond to a number of the plurality of green pixels in the first region, and the first density may have a value between 0 and 1.

The first density may be 1/9.

The second density may correspond to a number of the plurality of green pixels in the second region, and the second density may have a value between 0 and 1.

The second density may be twice the first density.

The display panel may further include a light blocking material provided on at least part of the photosensor.

The light blocking material may include at least one of an opaque tape, a white print, or a color print.

The black matrix may not have a hole in a display region of the display panel surrounding the second region.

A size of the first region and a size of the second region may be based on a size of the photosensor.

According to an embodiment of the disclosure, a field of view (FOV) may be improved by increasing light laterally incident on a display panel for an under display camera (UDC).

Further, according to an embodiment of the disclosure, an unintended malfunction may be reduced by reducing a light amount variation based on an incident angle through a light blocking material in a mechanism for controlling the luminance of a display panel according to an ambient brightness.

Further, according to an embodiment of the disclosure, the problem that a screen becomes dark according to an angle of an electronic device may be overcome, and the screen may not be turned on dark even when the electronic device is in a tilted state, by a mechanism for controlling the luminance of a display panel according to an ambient brightness during use of the electronic device. Therefore, usability may be improved.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
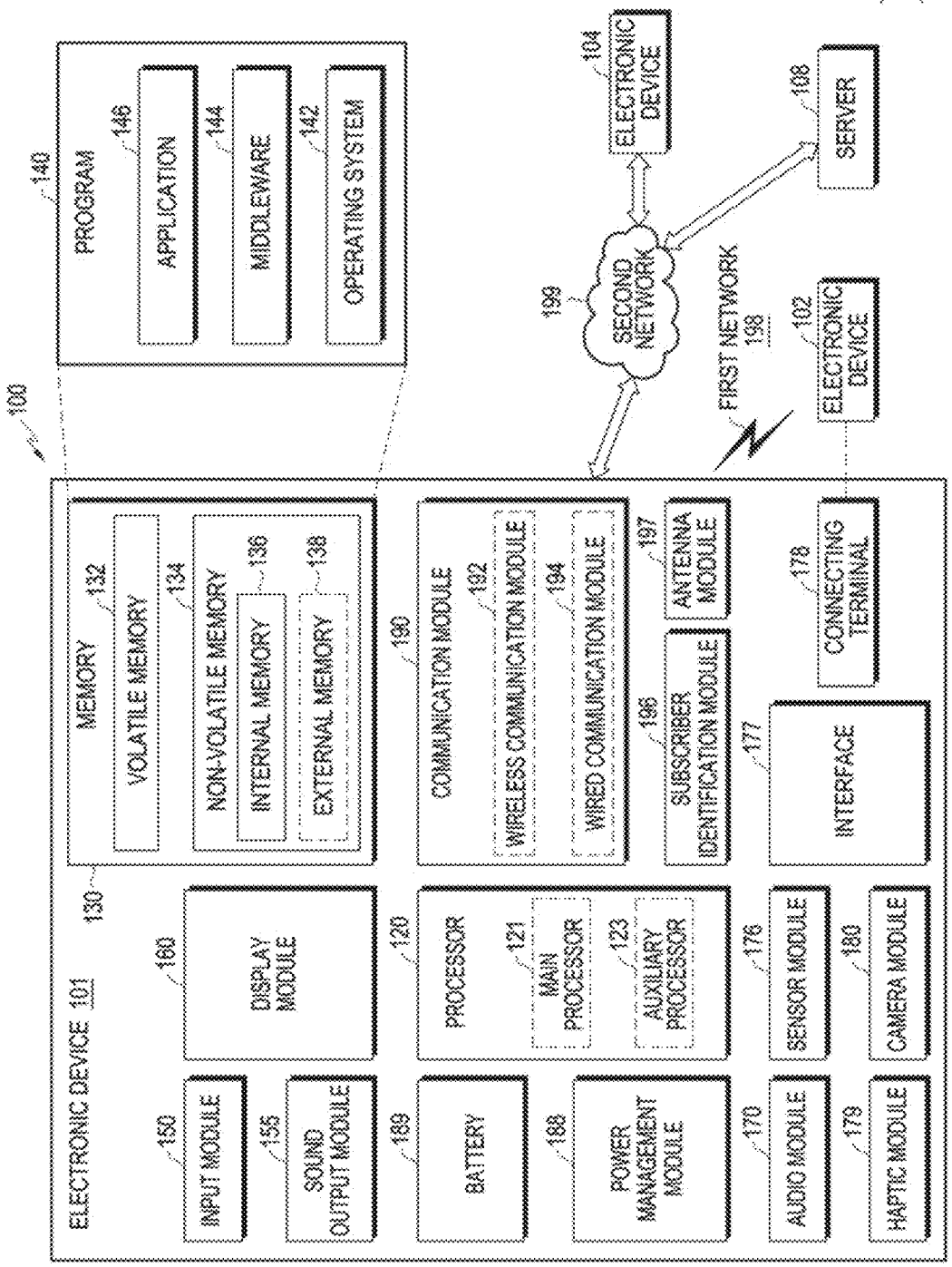
FIG. 1 is a block diagram illustrating an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
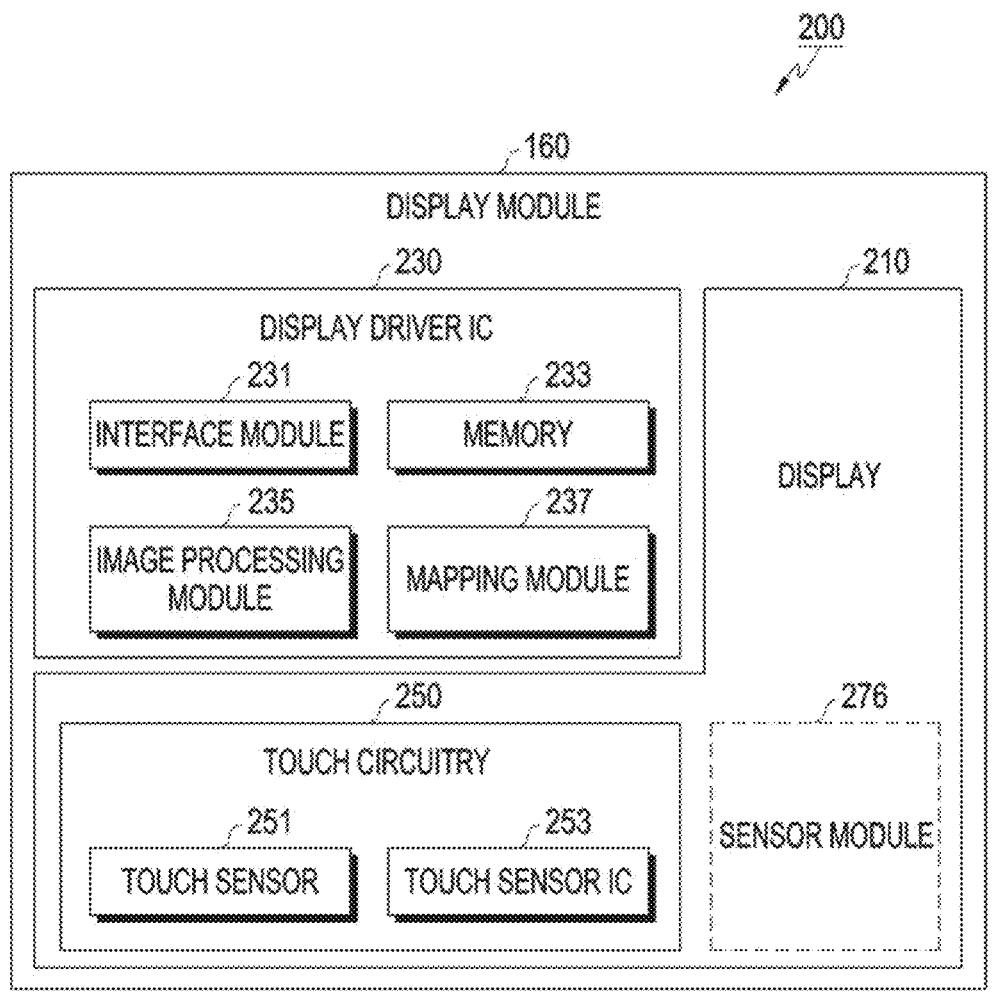
FIG. 2 is a block diagram illustrating a display device according to an embodiment.

FIG. 2 is a block diagram 200 illustrating the display module 160 according to various embodiments.

Referring to FIG. 2, the display module 160 may include a display 210 and a display driver integrated circuit (DDI) 230 to control the display 210. The DDI 230 may include an interface module 231, memory 233 (e.g., buffer memory), an image processing module 235, or a mapping module 237. The DDI 230 may receive image information that contains image data or an image control signal corresponding to a command to control the image data from another component of the electronic device 101 via the interface module 231. For example, according to an embodiment, the image information may be received from the processor 120 (e.g., the main processor 121 (e.g., an application processor)) or the auxiliary processor 123 (e.g., a graphics processing unit) operated independently from the function of the main processor 121. The DDI 230 may communicate, for example, with touch circuitry 250 or the sensor module 276 via the interface module 231. The DDI 230 may also store at least part of the received image information in the memory 233, for example, on a frame by frame basis. The image processing module 235 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 210. The mapping module 237 may generate a voltage value or a current value corresponding to the image data pre-processed or post-processed by the image processing module 235. According to an embodiment, the generating of the voltage value or current value may be performed, for example, based at least in part on one or more attributes of the pixels (e.g., an array, such as an RGB stripe or a pentile structure, of the pixels, or the size of each sub-pixel). At least some pixels of the display 210 may be driven, for example, based at least in part on the voltage value or the current value such that visual information (e.g., a text, an image, or an icon) corresponding to the image data may be displayed via the display 210.

According to an embodiment, the display module 160 may further include the touch circuitry 250. The touch circuitry 250 may include a touch sensor 251 and a touch sensor IC 253 to control the touch sensor 251. The touch sensor IC 253 may control the touch sensor 251 to sense a touch input or a hovering input with respect to a certain position on the display 210. To achieve this, for example, the touch sensor 251 may detect (e.g., measure) a change in a signal (e.g., a voltage, a quantity of light, a resistance, or a quantity of one or more electric charges) corresponding to the certain position on the display 210. The touch circuitry 250 may provide input information (e.g., a position, an area, a pressure, or a time) indicative of the touch input or the hovering input detected via the touch sensor 251 to the processor 120. According to an embodiment, at least part (e.g., the touch sensor IC 253) of the touch circuitry 250 may be formed as part of the display 210 or the DDI 230, or as part of another component (e.g., the auxiliary processor 123) disposed outside the display module 160.

According to an embodiment, the display module 160 may further include at least one sensor (e.g., a fingerprint sensor, an iris sensor, a pressure sensor, or an illuminance sensor) of the sensor module 276 or a control circuit for the at least one sensor. In such a case, the at least one sensor or the control circuit for the at least one sensor may be embedded in one portion of a component (e.g., the display 210, the DDI 230, or the touch circuitry 250)) of the display module 160. For example, when the sensor module 276 embedded in the display module 160 includes a biometric sensor (e.g., a fingerprint sensor), the biometric sensor may obtain biometric information (e.g., a fingerprint image) corresponding to a touch input received via a portion of the display 210. As another example, when the sensor module 276 embedded in the display module 160 includes a pressure sensor, the pressure sensor may obtain pressure information corresponding to a touch input received via a partial or whole area of the display 210. According to an embodiment, the touch sensor 251 or the sensor module 276 may be disposed between pixels in a pixel layer of the display 210, or over or under the pixel layer.

Figure 3:
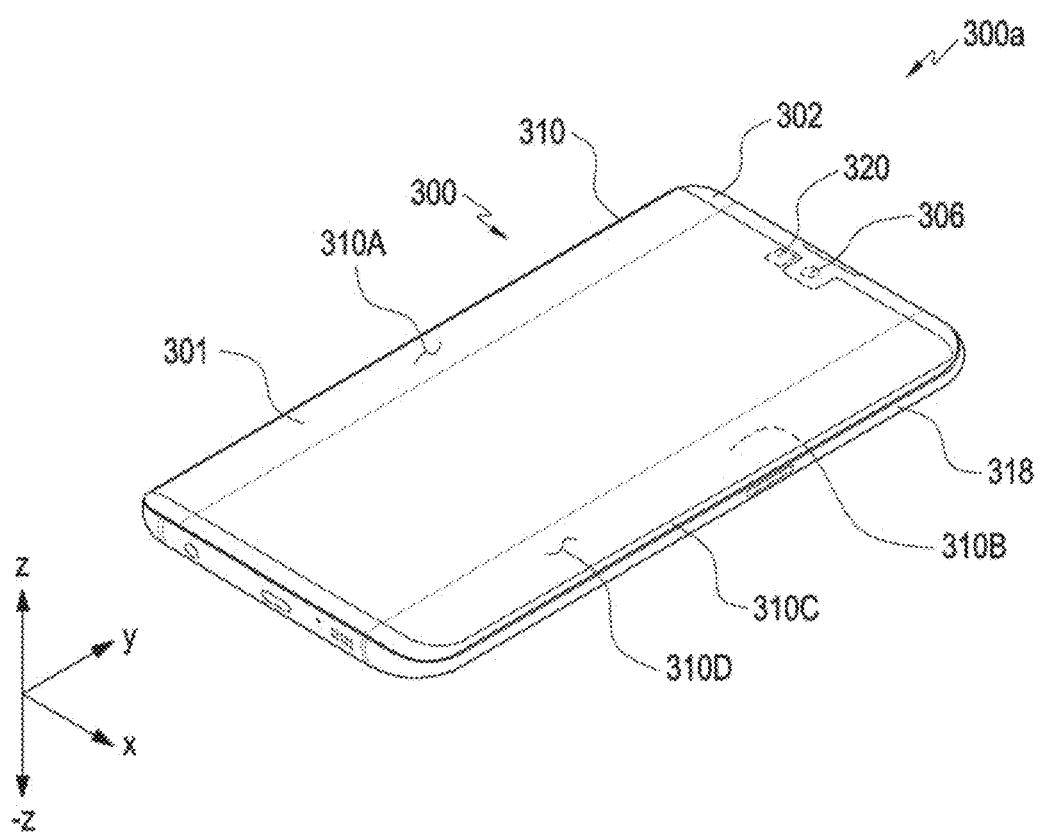
FIG. 3 is a perspective view illustrating an exemplary front surface of an electronic device according to an embodiment.

FIG. 3 is a perspective view 300a illustrating an exemplary front surface of an electronic device according to various embodiments.

An electronic device 300 of FIG. 3 may correspond to the electronic device 101 of FIG. 1. For example, the electronic device 300 may include some or all of the components included in the electronic device 101 of FIG. 1.

Referring to FIG. 3, while the electronic device 300 according to an embodiment of the disclosure is disclosed as an example of a bar-type electronic device, the electronic device 300 may be a slidable, rollable, and/or foldable type. The electronic device according to various embodiments of the disclosure may include various types of devices. The electronic device may include, for example, a wearable device or a home appliance. The electronic device according to an embodiment of the disclosure is not limited to the above-described devices.

Referring to FIG. 3, the electronic device 300 according to various embodiments may include a housing 310 including a first surface (or front surface) 310A, a second surface (or rear surface) 310B, and a side surface 310C surrounding a space between the first surfaces 310A and the second surface 310B. The electronic device 300 may include a display 301, an illuminance sensor 320, and/or a camera module 306.

The display 301 may be externally visible through a substantial portion of a front plate 302, for example. In some embodiments, at least part of the display 301 may be externally visible through the front plate 302 forming first regions 310D of the first surface 310A and the side surface 310C. In some embodiments, the corners of the display 301 may be formed to be in the same shapes as those of adjacent outer edges of the front plate 302 on the whole. In another embodiment, to expand the visible area of the display 301, the distance between the outer periphery of the display 301 and the outer periphery of the front plate 302 may be the same on the whole.

The camera module 306 may include a camera module 306 disposed at a top center of the first surface (or front surface) 310A included in the housing 310, and at least one camera module disposed on the second surface 310B. The each of camera modules may include one or more lenses, an image sensor, and/or an image signal processor.

According to an embodiment, the camera module 306 disposed on a top end of the first surface (or front surface) 310A may be an under display camera (UDC), and may be disposed under the display 301. For example, the camera module 306 disposed on the top end of the first surface (or front surface) 310A may be disposed between the display 301 and the second surface (or rear surface) 310B.

When viewed from above the first surface (or front surface) 310A included in the housing 310, the illuminance sensor 320 may be disposed between the display 301 and the second surface (or rear surface) 310B to overlap with an area of the display 301 adjacent to the top center of the front surface 310A. The illuminance sensor 320 may measure an external illuminance by using the intensity of light incident from the outside. The illuminance sensor 320 may receive external light to measure, identify, or determine the illuminance of an environment in which the electronic device 300 is located. The illuminance sensor 320 may include a light receiving element such as a photo diode (PD) capable of receiving light.

According to an embodiment, the illuminance sensor 320 may include a proximity illuminance sensor which is a single device (or module) into which an illuminance sensor and a proximity sensor are combined. According to some embodiments, the illuminance sensor 320 may include various sensors operating (or sensing) based on light, such as a picker sensor, a flicker sensor, a color sensor, and/or a spectrometer.

Figure 4:
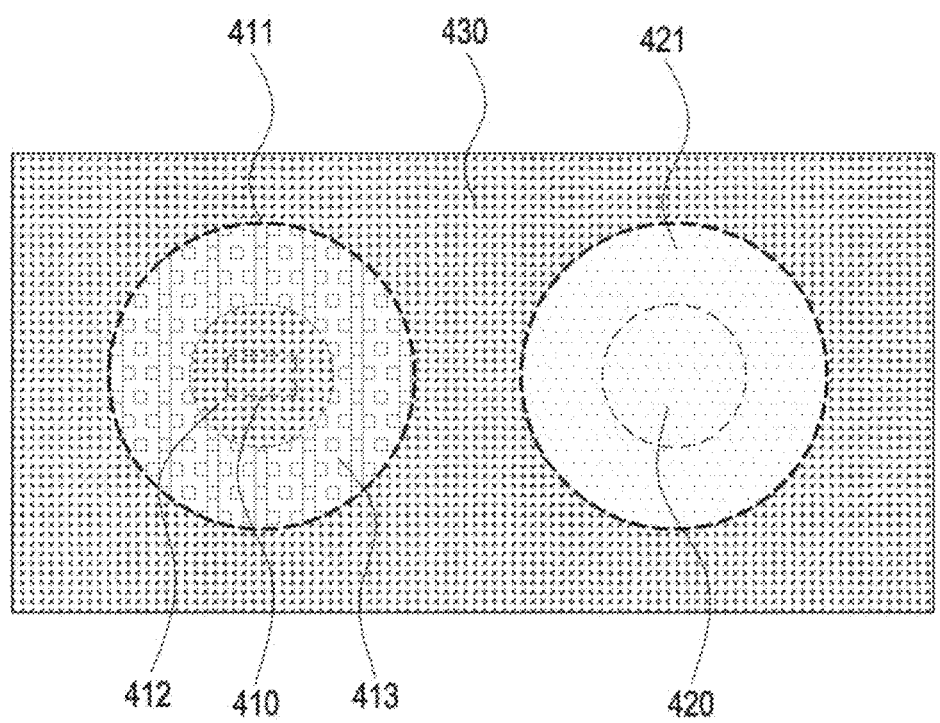
FIG. 4 is a diagram illustrating each region of a display panel according to an embodiment.

FIG. 4 is a diagram illustrating each region of a display panel according to an embodiment.

According to an embodiment, referring to FIG. 4, when an electronic device (e.g., the electronic device 300 of FIG. 3) is viewed from its front (e.g., a −z-axis direction in FIG. 3), a photosensor 410 (e.g., the sensor module 176 of FIG. 1) and a camera 420 (e.g., the camera module 180 of FIG. 1) may be disposed under a display panel (e.g., the display module 160 of FIG. 1). For example, the photosensor 410 and the camera 420 may be disposed between a housing and the display panel.

According to an embodiment, the photosensor 410, an image sensor (e.g., the camera 420), and a display may be disposed in the housing. According to an embodiment, each sensor may be disposed in the housing or embedded in the display (window or glass) according to the appearance of the electronic device.

According to an embodiment, the photosensor 410 may include any type of sensor using the intensity of light, such as a proximity sensor, an illuminance sensor, a spectrometer, or an ultraviolet (UV) sensor. According to an embodiment, the photosensor 410 may include a PD capable of receiving light.

According to an embodiment, the camera 420 may include a camera for taking a selfie disposed under a UDC display. According to an embodiment, the UDC may be visually perceived as a display by a user.

According to an embodiment, the display panel is a screen display device of the electronic device, and may be implemented as any one of a light-emitting diode (LED) display, an organic light-emitting diode (OLED) display, a quantum-dot LED (QLED) display, and a micro LED display. According to an embodiment, the display panel may include any UDC display panel using an LED-based element as a light emitting element.

According to an embodiment, the display panel may include a photosensor region 411 related to the photosensor 410, a camera region 421 related to the camera 420, and a display region 430.

According to an embodiment, the display region 430 may include at least one region with the photosensor 410 and the camera 420 not disposed therein under the display panel.

According to an embodiment, in the display region 430, red, green, and blue sub-pixels may be uniformly disposed, and a black matrix (BM) may be disposed between sub-pixels to prevent a circuit behind the display panel from being visually recognized from the outside. For example, the BM may include a light absorbing material to absorb light. The BM may prevent a region other than a light emitting region that emits light through a plurality of sub-pixels from being viewed from the outside. According to an embodiment, arrangement of a plurality of color pixels and a BM in the display region 430 will be described below with reference to FIG. 6C. According to an embodiment, the photosensor region 411 may receive external light through a hole penetrating between sub-pixels in a region in which an on cell film (OCF) and the BM are disposed like the display region 430. According to an embodiment, the photosensor region 411 may require a layout that enables reception of light for illuminance measurement, while reducing external visibility of the sensor.

According to an embodiment, the photosensor region 411 may include a first region 412 corresponding to the photosensor 410 and a second region 413 that is a region around (surrounding) the first region 412. According to an embodiment, the first region 412 corresponding to the photosensor 410 may correspond to the size of the photosensor 410 or may be determined in further consideration of a path of light emitted from the photosensor 410 or a path of light received at the photosensor 410. According to an embodiment, the first region 412 may be a region adjacent to the photosensor 410 on the display panel.

According to an embodiment, a plurality of holes having a first density may be provided in the first region 412 corresponding to the photosensor 410 in the photosensor region 411 of the display panel, and a plurality of holes having a second density higher than the first density may be provided in the second region 413 that is a region around the first region 412. According to an embodiment, arrangement of a plurality of sub-pixels and a plurality of holes in the first region 412 will be described below with reference to FIG. 6A, and arrangement of a plurality of sub-pixels and a plurality of holes in the second region 413 will be described below with reference to FIG. 6B.

According to an embodiment, to secure the transmittance of the photosensor 410 (e.g., an illuminance sensor), holes may be drilled between color filters (CFs) in a region in which an OCF and a BM are disposed, and the arrangement pattern and number of the holes may vary.

According to an embodiment, the number of holes to be added may vary according to a transmittance and visibility.

The transmittance may be secured by any method other than adding holes in a BM part.

According to an embodiment, a detailed description related to arrangement of holes will be given below with reference to FIGS. 5A, 5B and 5C.

According to an embodiment, the camera region 421 (e.g., a UDC region) is at least one region of the display panel, under which the camera 420 is disposed, and may need to have a relatively wider light-transmittable region compared to the photosensor region 411 because a subject needs to be captured. For example, unlike sub-pixel arrangements in FIGS. 6A, 6B and 6C, a plurality of (e.g., two) red pixels, a plurality of (e.g., four) green pixels, and a plurality of (e.g., two) blue pixels may form one pixel group, and each pixel group may be disposed at a certain interval in the camera region 421.

According to an embodiment, as light passes without a BM between pixel groups and an OCF is disposed in the camera region 421, the external visibility of the camera 420 may be improved, and reflection of external light may be reduced.

Figure 5A:
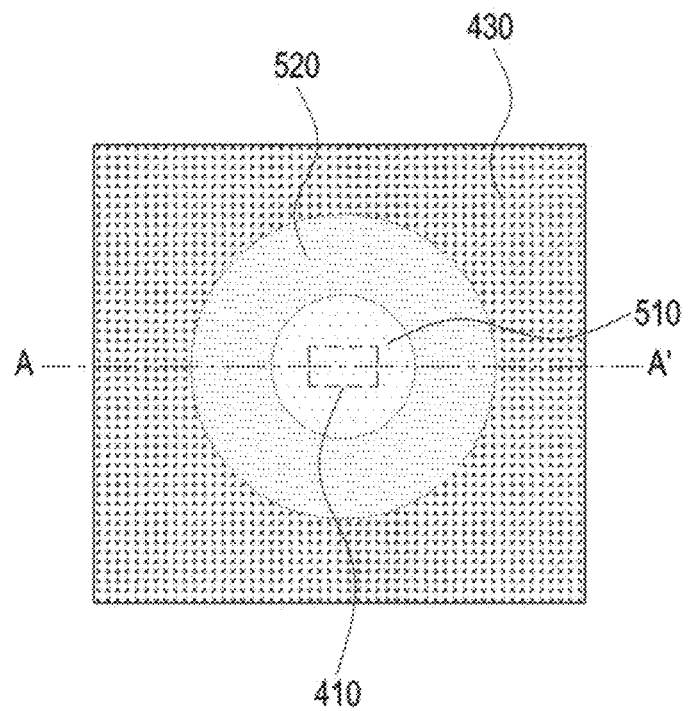
FIG. 5A is a diagram illustrating photo sensor regions according to an embodiment.

FIG. 5A is a diagram illustrating a photosensor region according to an embodiment.

According to an embodiment, referring to FIG. 5A, a display panel may include a photosensor region (e.g., the photosensor region 411 of FIG. 4) related to the photosensor 410, and the display region 430.

According to an embodiment, the photosensor region may include a first region 510 corresponding to the photosensor 410 and a second region 520 that is a region around the first region 510. According to an embodiment, the first region 510 corresponding to the photosensor 410 may correspond to the size of the photosensor 410, or may be determined in further consideration of a path of light emitted from the photosensor 410 or a path of light received at the photosensor 410. According to an embodiment, the first region 510 may be a region adjacent to the photosensor 410 on the display panel.

According to an embodiment, a plurality of holes may be provided at a first density in the first region 510. According to an embodiment, the first density may be obtained based on the number of a plurality of green pixels among a plurality of color pixels, and have a value between 0 and 1. According to an embodiment, a smaller number of holes than the number of the plurality of green pixels may be provided in the first region 510. For example, the first density may be about 1/9 (i.e., a ratio of 1 to 9).

According to an embodiment, arrangement of a plurality of color pixels and holes in the first region 510 will be described below with reference to FIG. 6A.

According to an embodiment, a plurality of holes may be provided at a second density higher than the first density in the second region 520. According to an embodiment, the second density may be obtained based on the number of a plurality of green pixels among a plurality of color pixels, and have a value between 0 and 1. According to an embodiment, the number of holes in the second region 520 may be fewer than a number of the plurality of green pixels in the second region 520 and more than the number of holes in the first region 510. For example, the second density may be about 2/9 (i.e., a ratio of 2 to 9).

According to an embodiment, arrangement of a plurality of color pixels and holes in the second region 520 will be described with reference to FIG. 6B.

According to an embodiment, the size of the first region 510 and the size of the second region 520 may be determined based on the size of the photosensor 410. For example, the size of the first region 510 and the size of the second region 520 may be determined based on the size of the PD included in the photosensor 410. According to an embodiment, the size of the first region 510 and the size of the second region 520 may be determined by further considering a separation distance between the display panel and the photosensor 410.

According to an embodiment, a BM may not have any holes in the display region 430 around the second region 520. Arrangement of a plurality of color pixels in the display region 430 according to an embodiment will be described below with reference to FIG. 6C.

According to an embodiment, the arrangement pattern and number of holes in the BM may vary according to the transmittance and visibility of the display panel.

According to an embodiment, a hole of the BM may be drilled between CFs in order to secure the transmittance of the photosensor 410, and the arrangement pattern and number of holes may vary.

Figure 5B:
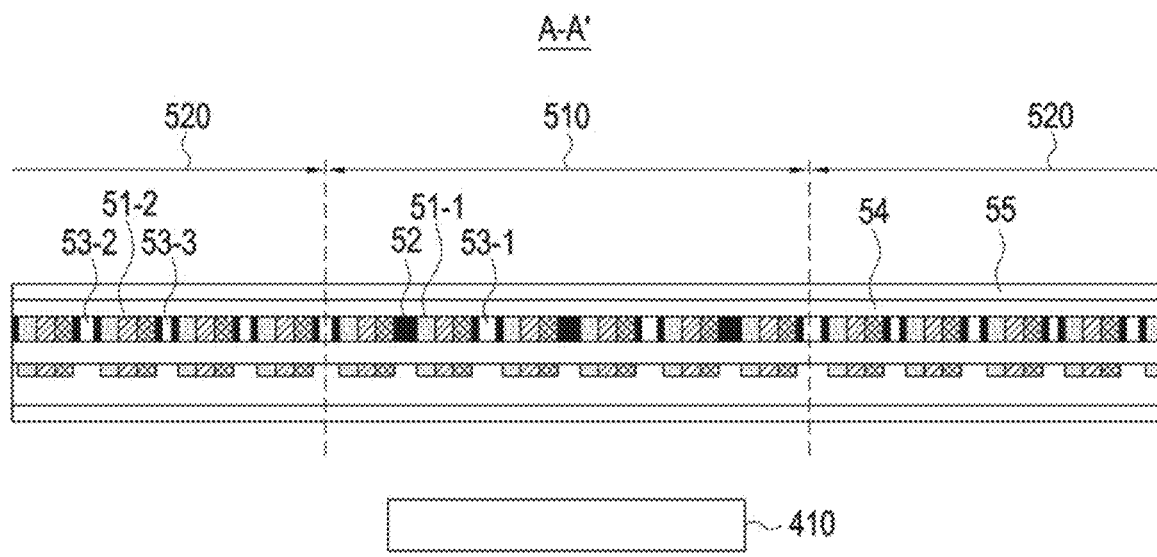
FIG. 5B is a diagram illustrating a cross-section of photosensor regions according to an embodiment.

FIG. 5B is a diagram illustrating a cross-section A-A' of a photosensor region according to an embodiment.

According to an embodiment, referring to FIG. 5B, the display panel may be disposed on the photosensor 410, and include the first region 510 and the second region 520. For example, the first region 510 may be a region corresponding to the photosensor 410 and adjacent to the photosensor 410, and the second region 520 may be a region around the first region 510.

According to an embodiment, the display panel may include a plurality of color pixels 51-1 and 51-2, a BM 52 and a plurality of holes 53-1, 53-2, and 53-3, which are disposed on a substrate 50. For example, the plurality of color pixels 51-1 and 51-2 may be OLEDs, and each color pixel may be at least one of a red pixel, a blue pixel, or a green pixel.

According to an embodiment, in the first region 510, the BM 52 may be disposed on one side (e.g., the left side) of a first color pixel 51-1, and a first hole 53-1 may be provided on the other side of the first color pixel 51-1. According to an embodiment, the first hole 53-1 may be provided in the BM, and the BM may be disposed between the first hole 53-1 and the first color pixel 51-1.

According to an embodiment, in the second region 520, a second hole 53-2 may be provided on one side (e.g., the left side) of a second color pixel 51-2, and a third hole 53-3 may be provided on the other side (e.g., the right side) of the second color pixel 51-2. According to an embodiment, the second hole 53-2 and the third hole 53-3 may be provided in the BM, and the BM may be disposed between the second hole 53-1 and the second color pixel 51-2 and between the third hole 53-3 and the second color pixel 51-2.

According to an embodiment, the density of holes in the second region 520 may be higher than that of holes in the first region 510. For example, the density of holes disposed in the second region 520 may be twice the density of holes disposed in the first region 510.

According to an embodiment, the display panel may include glass 54 disposed on the plurality of color pixels 51-1 and 51-2, the BM 52, and the plurality of holes 53-1, 53-2, and 53-3, and a protective layer 55 disposed on the glass 54. For example, the glass 54 may be ultra-thin glass (UTG) or polyimide (PI), and the protective layer 55 may be omitted.

Figure 5C:
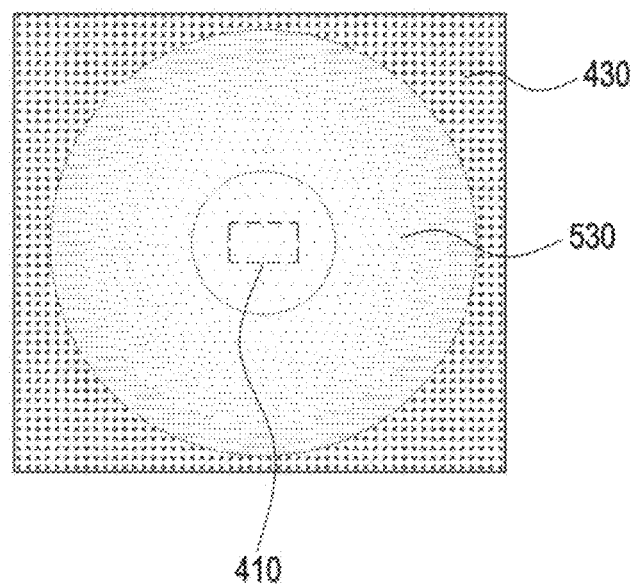
FIG. 5C is a diagram illustrating photosensor regions according to an embodiment.

FIG. 5C is a diagram illustrating a photosensor region according to an embodiment.

According to an embodiment, referring to FIG. 5C, the display panel may include a photosensor region 530 (e.g., the photosensor region 411 of FIG. 4) related to the photosensor 410, and the display region 430.

According to an embodiment, the photosensor region 530 may have a plurality of holes, and the density of holes may gradually increase from the photosensor 410 toward the display region 430. For example, the density of holes in the photosensor region may be the first density in a region close to the photosensor 410, and the second density higher than the first density in a region close to the display region 430, and the density of the holes may gradually increase from the photosensor 410 toward the display region 430.

According to an embodiment, while holes are provided in the second region 520 to secure a transmittance in FIGS. 5A, 5B and 5C, other methods of securing a transmittance may be applied.

Figure 6A:
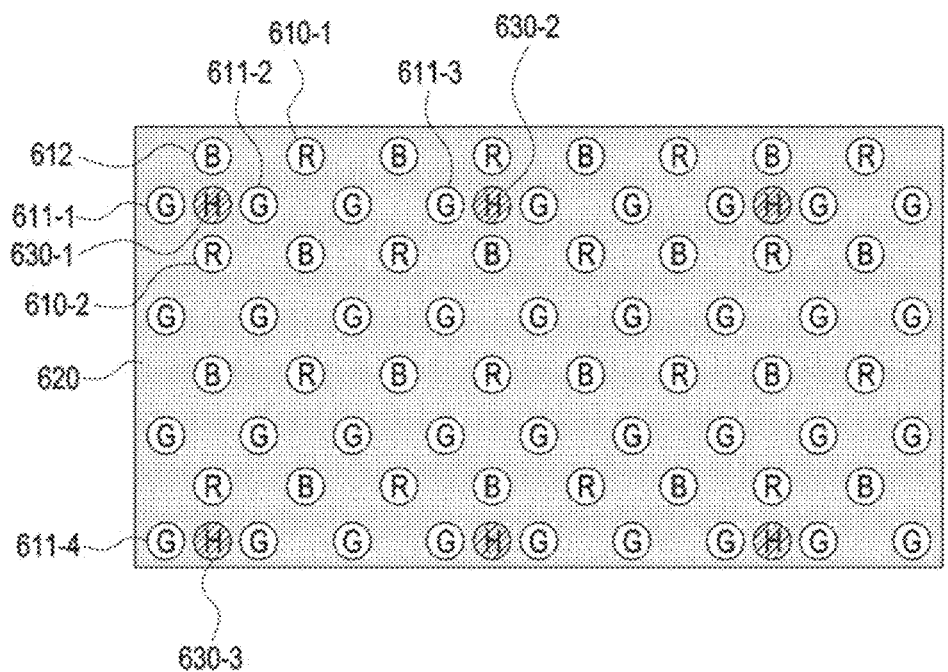
FIG. 6A is a diagram illustrating a first region among photosensor regions according to an embodiment.

FIG. 6A is a diagram illustrating a first region in a photosensor region according to an embodiment.

According to an embodiment, referring to FIG. 6A, a first region (e.g., the first region 510 of FIG. 5A) of a display panel (e.g., the display module 160 of FIG. 1) may include a plurality of color pixels 610-1, 610-2, 611-1, 611-2, 611-3, 611-4, and 612. For example, the plurality of color pixels may include a plurality of red pixels R 610-1 and 610-2, a plurality of green pixels G 611-1, 611-2, 611-3, and 611-4, and a plurality of blue pixels B 612.

For example, a plurality of red pixels R 610-1 and a plurality of blue pixels B 612 may be alternately disposed at specific intervals in a first row, and a plurality of green pixels G 611-1, 611-2, and 611-3 may be disposed at specific intervals in a second row under the first row.

According to an embodiment, a BM 620 may be disposed in spaces between the plurality of color pixels 610-1, 610-2, 611-1, 611-2, 611-3, 611-4, and 612. For example, the BM 620 may block between the plurality of color pixels 610-1, 610-2, 611-1, 611-2, 611-3, 611-4, and 612. Accordingly, light is not allowed to pass through a region in which the BM 620 is disposed.

According to an embodiment, a plurality of holes H 630-1, 630-2, and 630-3 may be provided in the BM 620. For example, the plurality of holes H 630-1, 630-2, and 630-3 may penetrate at least one region of the BM to allow light to be transmitted therethrough.

According to an embodiment, a hole closest to a first hole H 630-1 in an x-axis direction is referred to as a second hole H 630-2, and a hole closest to the first hole H 630-1 in a y-axis direction is referred to as a third hole H 630-3.

According to an embodiment, the plurality of holes H 630-1, 630-2, and 630-3 may be provided in the BM, each hole with a green pixel G 611-1, 611-2, 611-3, or 611-4 on each of the left and right sides of the hole, and a blue pixel B 612 or a red pixel R 610-2 above and below the hole. For example, the first hole H 630-1 may have the green pixel G 611-1 as a left pixel, the green pixel G 611-2 as a right pixel, the blue pixel B 612 as an upper pixel, and the red pixel R 610-2 as a lower pixel.

According to an embodiment, the configurations of pixels surrounding the second hole H 630-2 and the third hole H 630-3 may be similar to that of the first hole H 630-1. For example, the second hole H 630-2 and the third hole H 630-3 may have the green pixels G 611-3 and 611-4 as the left and right pixels, red pixels R as the upper pixels, and blue pixels B as the lower pixels.

According to an embodiment, one hole H per nine green pixels G may be disposed in the first region of the display panel illustrated in FIG. 6A. For example, two green pixels may be disposed between the green pixel G 611-1 which is the left pixel of the first hole H 630-1 and the green pixel G 611-3 which is the left pixel of the second hole H 630-2, and two green pixels may be disposed between the green pixel G 611-1 which is the left pixel of the first hole H 630-1 and the green pixel G 611-4 which is the left pixel of the third hole H 630-3.

According to an embodiment, the plurality of holes H 630-1, 630-2, and 630-3 may be provided at the first density obtained based on the number of the plurality of green pixels G 611-1, 611-2, 611-3, and 611-4. According to an embodiment, although a plurality of holes are provided at the first density based on the number of a plurality of green pixels in FIG. 6A, the disclosure is not limited thereto, and holes may be provided at a specified density based on color pixels uniformly disposed according to the pixel structure of the display panel, even though the color pixels are not green pixels.

According to an embodiment, the first density may be a value between 0 and 1. For example, the first density may be about 1/9, and the plurality of holes 630-1, 630-2, and 630-3 may be provided such that one hole is provided per nine green pixels.

The arrangement of color pixels and the arrangement and number of holes in a BM in FIG. 6A are only exemplary, and the arrangement of color pixels and the arrangement and number of holes may vary according to the transmittance and visibility of the display panel.

For example, the size of the photosensor may be 5 mm or less, and the first region (e.g., the first region 510 of FIG. 4) adjacent to the photosensor (e.g., the photosensor 410 of FIG. 4) may be a circle with a diameter of 2.5 mm based on the size of the photosensor. According to an embodiment, it may be advantageous that the size of the first region is small in order to reduce the visibility of the photosensor.

According to an embodiment, when the size of the photosensor is X, the size of the first region may be between X−a and X+a, and the size of the second region (e.g., the second region 520 of FIG. 4) may be X+2*(air gap). According to an embodiment, the air gap refers to the distance between the display panel and the photosensor, and when the air gap is large, the size of the second region may also increase. According to an embodiment, when the density of holes in the first region is the first density, the density of holes in the second region may be about twice or three times the first density.

According to an embodiment, the diameter of a hole may be about 15 μm, and a maximum value of the diameter of the hole may be a spacing between color pixels.

According to an embodiment, the density of holes may be determined in further consideration of the resolution (e.g., in pixels per inch (ppi)) of the display panel. For example, when the ppi of the display panel is about 374, the spacing between pixels may be about 60 to 70 μm, and as the ppi of the display increases, the spacing between pixels may decrease, and the size of the hole may increase. According to an embodiment, when the size of the hole does not increase, the density of holes may increase.

As such, a total opened size should satisfy a minimum condition for driving the photosensor in consideration of the size of a hole, the density of holes, and the size of the first region and/or the second region. Because the size of the photosensor and the size of the air gap between the display panel and the photosensor are different in each electronic device, the minimum condition for driving the photosensor may be different in each electronic device. Accordingly, the size of a hole, the density of holes, and the size of the first region and/or the second region may vary.

Figure 6B:
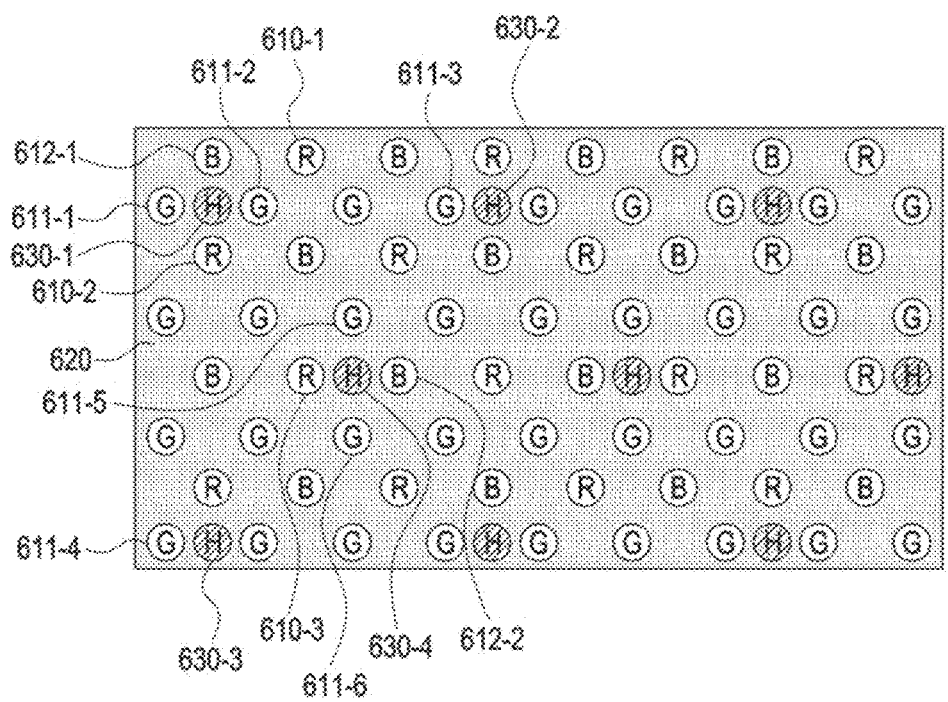
FIG. 6B is a diagram illustrating a second region among photosensor regions according to an embodiment.

FIG. 6B is a diagram illustrating a second region in a photosensor region according to an embodiment.

According to an embodiment, referring to FIG. 6B, a second region (e.g., the second region 520 of FIG. 5A) of a display panel (e.g., the display module 160 of FIG. 1) may include a plurality of color pixels 610-1, 610-2, 610-3, 611-1, 611-2, 611-3, 611-4, 611-5, 611-6, 612-1, and 612-2. For example, the plurality of color pixels may include a plurality of red pixels R 610-1, 610-2, and 610-3, a plurality of green pixels G 611-1, 611-2, 611-3, 611-4, 611-5, and 611-6, and a plurality of blue pixels B 612-1 and 612-2.

For example, a plurality of red pixels R 610-1 and a plurality of blue pixels B 612-1 may be alternately disposed at specific intervals in a first row, and a plurality of green pixels G 611-1, 611-2, and 611-3 may be disposed at specific intervals in a second row under the first row.

According to an embodiment, the BM 620 may be disposed in spaces between the plurality of color pixels 610-1, 610-2, 610-3, 611-1, 611-2, 611-3, 611-4, 611-5, 611-6, 612-1, and 612-2. For example, the BM 620 may block between the plurality of color pixels 610-1, 610-2, 610-3, 611-1, 611-2, 611-3, 611-4, 611-5, 611-6, 612-1, and 612-2. Accordingly, light is not transmittable through a region in which the BM 620 is disposed.

According to an embodiment, a plurality of holes H 630-1, 630-2, 630-3, and 630-4 may be provided in the BM 620. For example, the plurality of holes H 630-1, 630-2, 630-3, and 630-4 may penetrate at least one region of the BM to allow light to be transmitted therethrough.

According to an embodiment, a hole closest to a first hole H 630-1 in the x-axis direction is referred to as a second hole H 630-2, a hole closest to the first hole H 630-1 in the y-axis direction is referred to as a third hole H 630-3, and a hole added to the display panel illustrated in FIG. 6A is referred to as a fourth hole H 630-4.

According to an embodiment, among the plurality of holes H 630-1, 630-2, 630-3, and 630-4, first, second, and third holes H 630-1, 630-2, and 630-3 may be provided in the BM, each hole with a green pixel G 611-1, 611-2, 611-3, or 611-4 on each of the left and right sides of the hole, and a blue pixel B 612 or a red pixel R 610-2 above and below the hole. For example, the first hole H 630-1 may have the green pixel G 611-1 as a left pixel, the green pixel G 611-2 as a right pixel, the blue pixel B 612 as an upper pixel, and the red pixel R 610-2 as a lower pixel.

According to an embodiment, the configurations of pixels surrounding the second hole H 630-2 and the third hole H 630-3 may be similar to that of the first hole H 630-1. For example, the second hole H 630-2 and the third hole H 630-3 may have the green pixels G 611-3 and 611-4 as the left and right pixels, red pixels R as the upper pixels, and blue pixels B as the lower pixels.

According to an embodiment, two holes H per nine green pixels G may be disposed in the first region of the display panel illustrated in FIG. 6A. For example, two green pixels G may be disposed between the green pixel G 611-1 which is the left pixel of the first hole H 630-1 and the green pixel G 611-3 which is the left pixel of the second hole H 630-2, and two green pixels may be disposed between the green pixel G 611-1 which is the left pixel of the first hole H 630-1 and the green pixel G 611-4 which is the left pixel of the third hole H 630-3. According to an embodiment, the display panel illustrated in FIG. 6B may further include fourth holes H 630-4, compared to the display panel illustrated in FIG. 6A.

According to an embodiment, the fourth hole H 630-4 may be provided at a point at which the distance to the first hole H 630-1, the distance to the second hole H 630-2, and the distance to the third hole H 630-3 are equal, on a straight line connecting the second hole H 630-2 to the third hole H 630-3. The fourth hole H 630-4 may have the red pixel R 610-3 as a left pixel, the blue pixel B 612-2 as a right pixel, the green pixel G 611-5 as an upper pixel, and the green pixel G 611-6 as a lower pixel. According to an embodiment, while two holes H per nine green pixels G are included in FIG. 6B, three or more holes H per nine green pixels G may be included, and the arrangement of holes H may differ depending on the number of the holes H.

According to an embodiment, the plurality of holes H 630-1, 630-2, 630-3, and 630-4 may be provided at a second density obtained based on the number of the plurality of green pixels G 611-1, 611-2, 611-3, 611-4, 611-5, and 611-6. According to an embodiment, although a plurality of holes are provided at the second density based on the number of a plurality of green pixels in FIG. 6B, the disclosure is not limited thereto, and holes may be provided at a specified density based on color pixels uniformly disposed according to the pixel structure of the display panel, even though the color pixels are not green pixels.

According to an embodiment, the second density may be higher than the first density of FIG. 6A and have a value between 0 and 1. For example, the second density may be about 2/9, and the plurality of holes H 630-1, 630-2, 630-3, and 630-4 may be provided such that two holes per nine green pixels are disposed.

The arrangement of color pixels and the arrangement and number of holes in a BM in FIG. 6B are only exemplary, and the arrangement of color pixels and the arrangement and number of holes may vary according to the transmittance and visibility of the display panel.

Figure 6C:
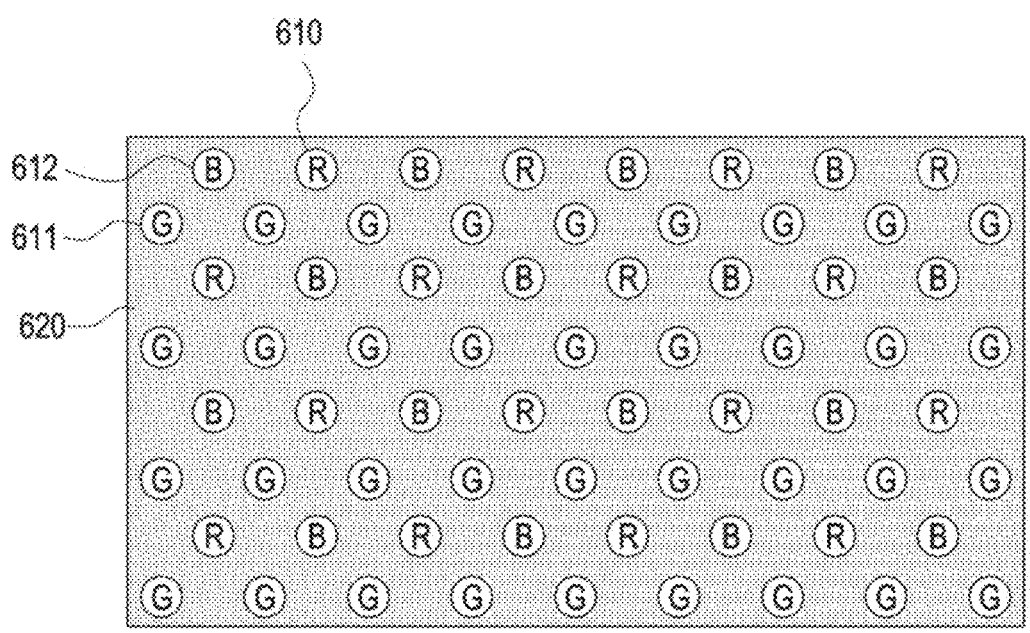
FIG. 6C is a diagram illustrating a display region according to an embodiment.

FIG. 6C is a diagram illustrating a display region according to an embodiment.

According to an embodiment, referring to FIG. 6C, a display region (e.g., the display region 430 of FIG. 4 or 5A) of a display panel (e.g., the display module 160 of FIG. 1) may include a plurality of color pixels 610, 611, and 612. For example, the plurality of color pixels may include a plurality of red pixels 610, a plurality of green pixels 611, and a plurality of blue pixels 612.

For example, a plurality of red pixels 610 and a plurality of blue pixels 612 may be alternately disposed at specific intervals in a first row, and a plurality of green pixels 611 may be disposed at specific intervals in a second row below the first row.

According to an embodiment, the BM 620 may be disposed in spaces between the plurality of color pixels 610, 611, and 612. For example, the BM 620 may block between the plurality of color pixels 610, 611, and 612. Accordingly, light is not transmittable through a region in which the BM 620 is disposed.

The arrangement of the color pixels in FIG. 6C is merely an example, and the arrangement of the color pixels and the ratio of each color pixel may vary.

Figure 7B:
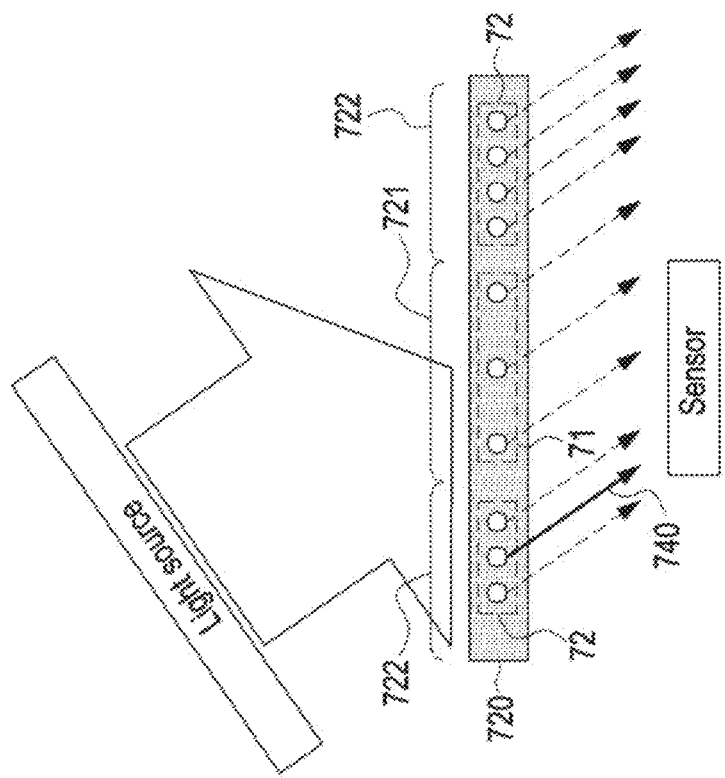
FIGS. 7A and 7B are diagrams illustrating incident paths of a display panel according to an embodiment.
Figure 7A:
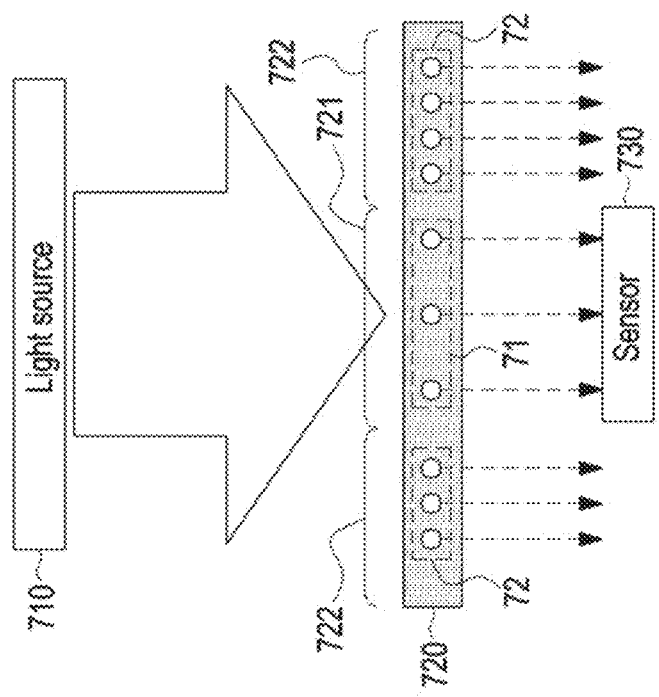

FIGS. 7A and 7B are diagrams illustrating incident paths of a display panel according to an embodiment. For example, FIG. 7A illustrates a case in which light is incident directly on the display panel, and FIG. 7B illustrates a case in which light is incident laterally on the display panel.

According to an embodiment, referring to FIG. 7A, light from a light source 710 outside a display panel 720 may be directly incident on the display panel 720. For example, the light source 710 may be a natural lighting such as the sun or an indoor lighting. For example, being incident directly may mean that an angle between the incident light and the direction of a surface of the display panel is 0 degrees.

According to an embodiment, the display panel 720 may include a first region 721 (e.g., the first region 510 of FIG. 5A) corresponding to a photosensor 730 (e.g., the photosensor 410 of FIG. 4 or 5A) and a second region 722 (e.g., the second region 520 of FIG. 5A) that is a region around the first region 721.

According to an embodiment, the light from the light source 710 may pass through a plurality of holes 71 (e.g., the first, second and third holes 630-1, 630-2 and 630-3 of FIG. 6A) included in the first region 721 and a plurality of holes 72 (e.g., the first to fourth holes 630-1 to 630-4 of FIG. 6B) included in the second region 722, and may be incident down the display panel 720. According to an embodiment, the plurality of holes 71 may be provided at a first density in the first region 721, and the plurality of holes 72 may be provided at a second density higher than the first density in the second region 722.

According to an embodiment, when direct light from the light source 710 passes through the plurality of holes 71 included in the first region 721 and the plurality of holes 72 included in the second region 722, the photosensor 730 may measure a light intensity (e.g., illuminance) based on the light passing through the plurality of holes 71 included in the first region 721. According to an embodiment, when direct light from the light source 710 passes through the plurality of holes 71 included in the first region 721 and the plurality of holes 72 included in the second region 722, even though a plurality of holes are provided at the second density higher than the first density in the second region 722, this may not affect a light intensity measured by the photosensor 730.

According to an embodiment, referring to FIG. 7B, light from the light source 710 outside the display panel 720 may be incident laterally on the display panel 720. For example, the light source 710 may be a natural light such as the sun or an indoor lighting. For example, being incident laterally may mean that an angle between the incident light and the direction of the surface of the display panel is greater than 0 degrees and less than 90 degrees.

According to an embodiment, the display panel 720 may include the first region 721 that is a region corresponding to the photosensor 730 and the second region 722 that is a region around the first region 721.

According to an embodiment, light from the light source 710 may pass through the plurality of holes 71 included in the first region 721 and the plurality of holes 72 included in the second region 722, and may be incident down the display panel 720. According to an embodiment, the plurality of holes 71 may be provided at the first density in the first region 721, and the plurality of holes 72 may be provided at the second density higher than the first density in the second region 722.

According to an embodiment, when lateral light from the light source 710 passes through the plurality of holes 71 included in the first region 721 and the plurality of holes 72 included in the second region 722, additionally incident light 740 may be input to the photosensor 730 because a plurality of holes are provided at the second density higher than the first density in the second region 722. Accordingly, even in the case of lateral light, more light may be incident in the second region 722 than when a plurality of holes are provided at the first density, thereby compensating an FOV.

According to an embodiment, even though the FOV satisfies a set angle (e.g., 45 degrees), when an electronic device (e.g., the electronic device 101 of FIG. 1) is tilted with respect to light incident at the same angle, the light intensity may decrease. According to an embodiment, when the intensity of light transmitted through the center of the first region 721 corresponding to the photosensor 730 decreases, the ratio of the intensity of lateral incident light to the intensity of direct incident light may be increase, thus improving the FOV. According to an embodiment, an embodiment of decreasing the transmittance of a center portion of the first region 721 corresponding to the photosensor 730 will be described below with reference to FIGS. 8A to 8D.

Figure 8A:
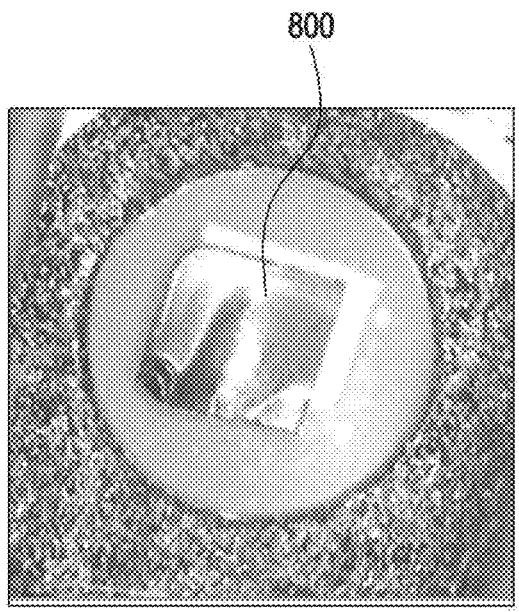
FIGS. 8A and 8B are diagrams illustrating a light blocking material disposed on a photosensor according to embodiments.
Figure 8B:
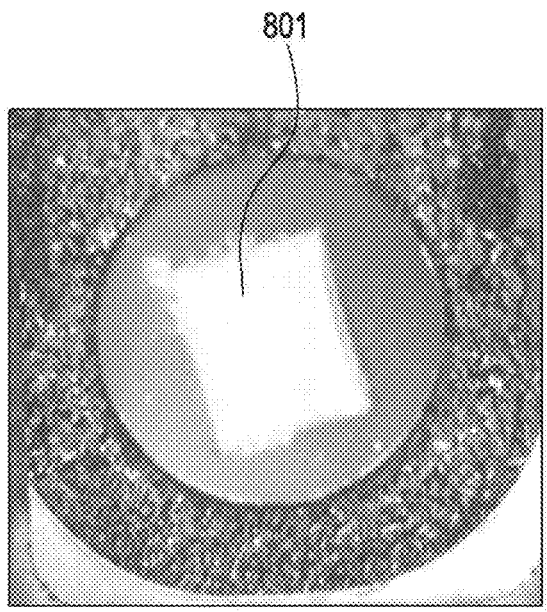

FIGS. 8A and 8B are diagrams illustrating a light blocking material disposed on a photosensor according to embodiments.

According to embodiments, referring to FIGS. 8A and 8B, light blocking materials 800 and 801 may be further disposed at the center of the photosensor. For example, the light blocking material may be an opaque tape 800 as illustrated in FIG. 8A, or a white print 801 as illustrated in FIG. 8AB.

According to an embodiment, as illustrated in FIGS. 8A and 8B, the transmittance of lateral light in four directions may increase compared to direct light by further disposing the light blocking materials 800 and 801 at the center of the photosensor and thus decreasing the intensity of light transmitted through the center of the photosensor. Therefore, the FOV may be improved. According to an embodiment, the increase in the transmittance of lateral light in four directions compared to direct light will be described below with reference to FIGS. 8C and 8D.

Figure 8C:
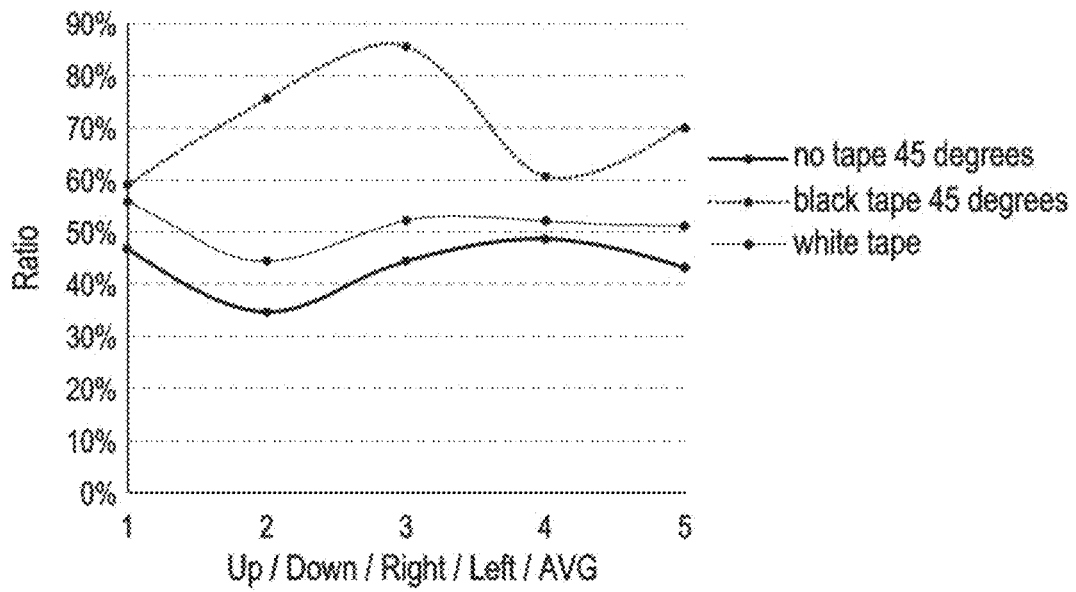
FIGS. 8C and 8D are graphs showing a transmittance, when a light blocking material is further disposed on a photosensor according to embodiments.
Figure 8D:
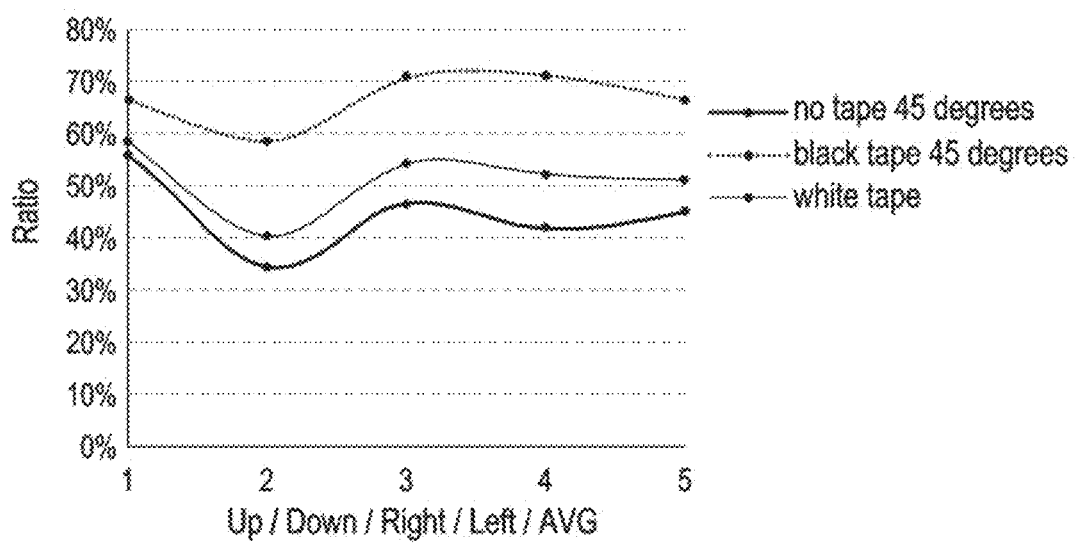

FIG. 8C and 8D are graphs showing a transmittance when a light blocking material is further disposed on a photosensor according to embodiments.

According to an embodiment, FIGS. 8C and 8D illustrate the transmittance (no tape 45 degrees) of lateral light, compared to direct light in the case of no light blocking material, the transmittance (black tape 45 degrees) of lateral light compared to direct light in the case of a dark light blocking material, and the transmittance (white tape) of lateral light compared to direct light in the case of a bright light blocking material.

According to an embodiment, referring to FIGS. 8C and 8D, when there is no light blocking material, the transmittances of lateral light in four directions (e.g., up, down, right, and left) and an average transmittance (e.g., avg) compared to direct light may be lowest, less than 50%.

According to an embodiment, when a bright light blocking material disposed at the center of the photosensor, the transmittances of lateral light in four directions (e.g., up, down, right, and left) and an average transmittance (e.g., avg) compared to direct light is about 50%, higher than in the case of no light blocking material on the whole.

According to an embodiment, when a dark light blocking material is disposed at the center of the photosensor, the transmittances of lateral light in four directions (e.g., up, down, right, and left) and an average transmittance (e.g., avg) compared to direct light may be about 60% to about 80%, higher than in the case of a bright light blocking material on the whole.

Referring to the above, it may be noted that the transmittance of lateral light relative to direct light is higher in the case of a light blocking material than in the case of no light blocking material, because as the color of the light blocking material is darker, the intensity of transmitted direct light is lower. Accordingly, when a light blocking material, for example, a dark light blocking material is disposed at the center of the photosensor, the FOV may be improved.

Figure 8E:
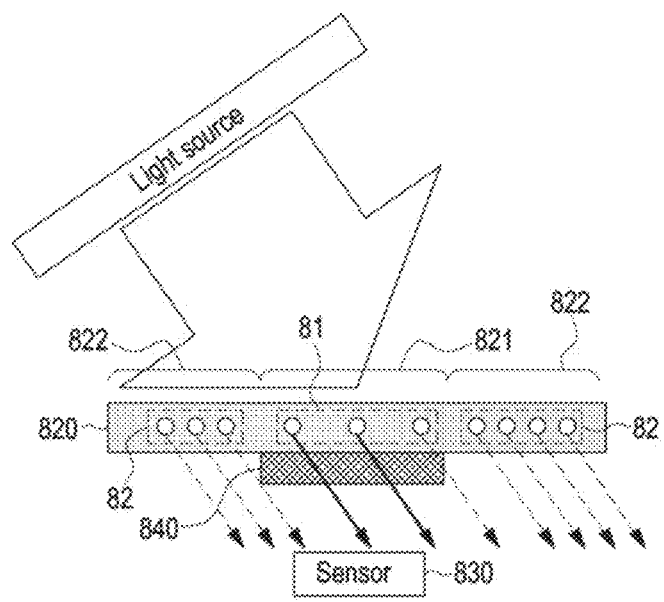
FIG. 8E is a diagram illustrating an embodiment in which a light blocking material is further disposed on a display panel.

FIG. 8E is a diagram illustrating an embodiment in which a light blocking material is further disposed on a display panel.

According to an embodiment, referring to FIG. 8E, light from a light source 810 outside a display panel 820 may be directly or laterally incident on the display panel 820. For example, the light source 810 may be a natural lighting such as the sun or an indoor lighting.

According to an embodiment, the display panel 820 may include a first region 821 (e.g., the first region 510 of FIG. 5A) corresponding to a photosensor 830 (e.g., the photosensor 410 of FIG. 4 or 5A), and a second region 822 (e.g., the second region 520 of FIG. 5A) that is a region around the first region 821.

According to an embodiment, a light blocking material 840 may be further disposed in at least part of the first region 821. For example, the light blocking material 840 may be disposed under the first region 821 of the display panel 820.

According to an embodiment, the light blocking material 840 may include at least one of an opaque tape, a white print, or a color print. According to an embodiment, the light blocking material 840 may be of a size enough to cover a region of the display panel 820 facing the photosensor 410 or the first region 821 including the region of the display panel 820 facing the photosensor 410.

According to an embodiment, when light is directly incident from the light source 810, the light incident on the photosensor 830 through a plurality of holes in the first region 821 passes through the light blocking material 840. Therefore, the intensity of light at 0 degrees at which incident light has the maximum intensity may be smaller than when the light blocking material 840 is not present.

According to an embodiment, when light from the light source 810 is laterally incident, light is additionally incident through a plurality of holes provided at the second density in the second region 822. The resulting increase of the intensity of light measured by the photosensor 830 may lead to improvement of the FOV.

According to an embodiment, a change in the FOV according to the presence or absence of a light blocking material will be described with reference to FIG. 9.

Figure 8F:
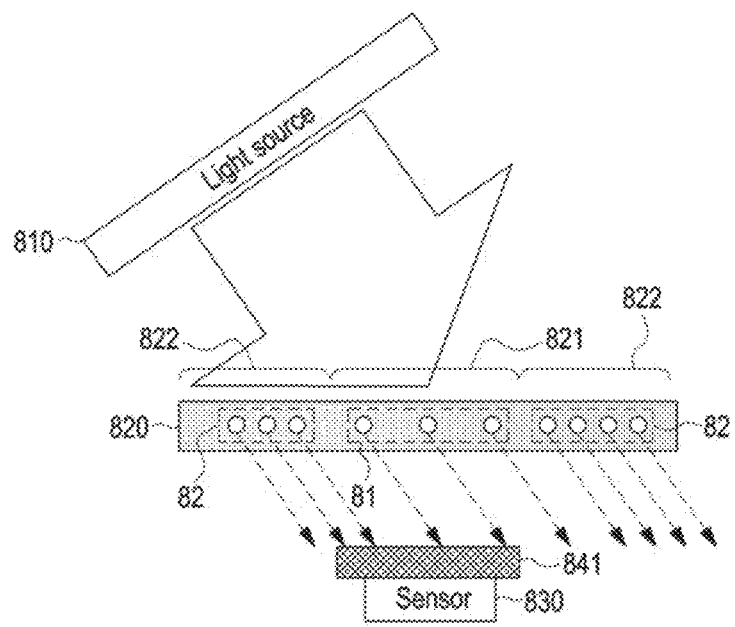
FIG. 8F is a diagram illustrating an embodiment in which a light blocking material is further disposed on a photosensor.

FIG. 8F is a diagram illustrating an embodiment in which a light blocking material is further disposed on a photosensor.

According to an embodiment, referring to FIG. 8F, light from the light source 810 outside the display panel 820 may be directly or laterally incident on the display panel 820. For example, the light source 810 may be a natural lighting such as the sun or an indoor lighting.

According to an embodiment, the display panel 820 may include the first region 821 that is a region corresponding to the photosensor 830 and the second region 822 that is a region around the first region 821.

According to an embodiment, a light blocking material 841 may be further disposed on at least part of the photosensor 830. For example, the light blocking material 841 may be disposed on a center region of the photosensor 830.

According to an embodiment, the light blocking material 841 may include at least one of an opaque tape, a white print, or a color print. According to an embodiment, the light blocking material 841 may be of a size enough to cover one surface of the photosensor 410 or the first region 821.

According to an embodiment, when light is directly incident from the light source 810, the light incident on the photosensor 830 through the plurality of holes in the first region 821 passes through the light blocking material 841. Therefore, the intensity of light at 0 degrees at which incident light has the maximum intensity may be smaller than when the light blocking material 841 is not present.

According to an embodiment, when light from the light source 810 is laterally incident, light is additionally incident through the plurality of holes provided at the second density in the second region 822, and part of the additional incident light is incident in at least one region the photosensor 830 with the light blocking material 841 not disposed therein. The resulting increase of the intensity of light measured by the photosensor 830 may lead to improvement of the FOV.

According to an embodiment, a change in the FOV according to the presence or absence of a light blocking material will be described with reference to FIG. 9.

Figure 9:
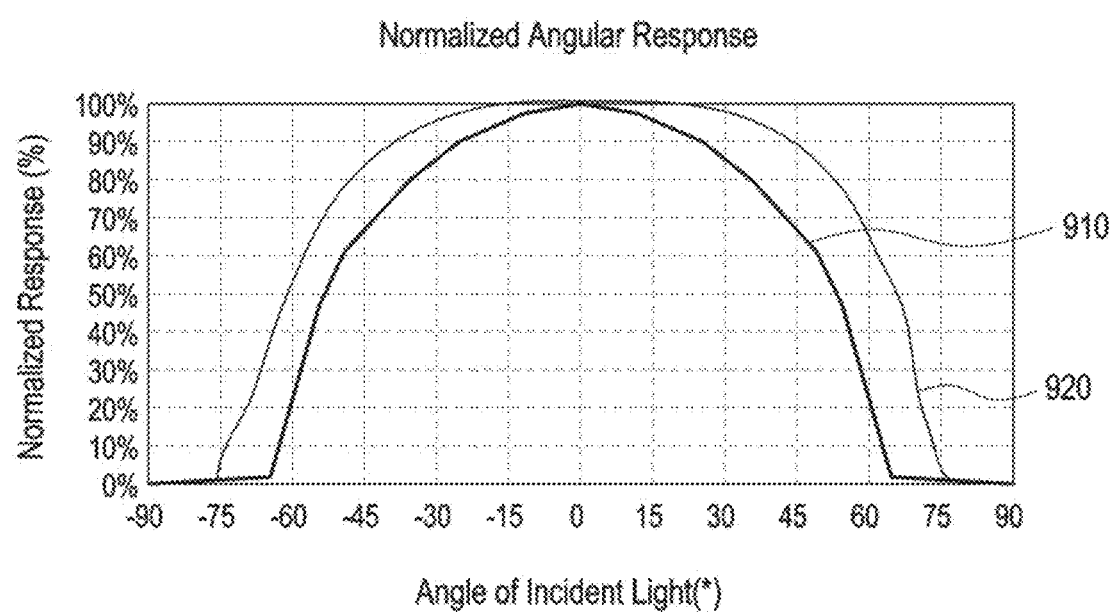
FIG. 9 is a diagram referred to for describing the intensity of incident light according to the presence or absence of a light blocking material and the angle of the incident light.

FIG. 9 is a diagram referred to for describing the intensity of incident light according to the presence or absence of a light blocking material and the angle of the incident light.

According to an embodiment, referring to FIG. 9, the intensity of light 910 according to an incident angle when a light blocking material is not provided, and the intensity of light 920 according to an incident angle when the light blocking material is provided are illustrated.

According to an embodiment, the maximum intensity of the light 920 when the light blocking material is provided may be smaller than that of the light 910 when the light blocking material is not provided. For example, when the intensity of light is greatest, the incident angle may be 0 degrees.

In FIG. 9, the light intensity according to the incident angle is normalized so that a measurable maximum light intensity is 100%.

For example, although an absolute maximum intensity of the light 920 when the light blocking material is disposed may be smaller than that of the light 910 when the light blocking material is not provided, the maximum intensity of the light 920 when the light blocking material is provided may also be 100% according to the normalization.

According to an embodiment, in the case of lateral light, light incident through holes in a region to which the light blocking material is not attached is measured. Therefore, when the light blocking material is provided, the intensity of light in the case of lateral light compared to the intensity of light at an incident angle of zero degrees may be greater.

For example, an incident angle at which a light intensity is 50% based on the maximum intensity 100% of the light 910 when no light blocking material is provided is about −54 degrees and about 54 degrees, and thus the FOV is 54 degrees, while an incident angle at which a light intensity is 50% based on the maximum intensity 100% of the light 920 when the light blocking material is provided is about −60 degrees and about 60 degrees, and thus the FOV may be 60.

As illustrated in FIG. 9, when the light blocking material is provided in the region of the display panel corresponding to the photosensor or the center region of the photosensor, the total amount of light incident on the photosensor may decrease. However, because the photosensor used in the UDC environment may have a resolution difference and a leveling difference of illuminance due to a minute difference in light, the decrease of a light intensity variation based on an incident angle by the light blocking material may reduce an unintended malfunction in a mechanism for controlling the luminance of a display panel according to an ambient brightness.

As described above, according to one or more embodiments, an electronic device (e.g., the electronic device 101 of FIG. 1) may include a housing, a display panel (e.g., the display module 160 of FIG. 1) including a plurality of color pixels (e.g., the plurality of color pixels 610, 611 and 612 of FIG. 6A or FIG. 6B) and a BM (e.g., the BM 620 of FIG. 6A or FIG. 6B) disposed in a space between the plurality of color pixels, and a photosensor (e.g., the sensor module 176 of FIG. 1) disposed between the housing and the display panel. In the BM, a plurality of holes (e.g., the plurality of holes 630-1 and 630-2 in FIG. 6A) having a first density may be provided in a first region (e.g., the first region 510 of FIG. 5A) corresponding to the photosensor, and a plurality of holes (e.g., the plurality of holes 630-1, 630-2, and 630-3 in FIG. 6B) having a second density higher than the first density may be provided in a second region (e.g., the second region 520 of FIG. 5A) being a region around the first region.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device comprising:
   a housing;
   a display panel comprising a plurality of color pixels and a black matrix provided between the plurality of color pixels; and
   a photosensor provided between the housing and the display panel,
   wherein the display panel has a first region corresponding to the photosensor and a second region surrounding the first region, and
   wherein the black matrix has a first plurality of holes having a first density in the first region, and a second plurality of holes having a second density in the second region, and the second density is higher than the first density.

2. The electronic device of claim 1, wherein the plurality of color pixels comprise a plurality of green pixels, and
   wherein the first density corresponds to a number of a plurality of green pixels in the first region, and the first density has a value between 0 and 1.

3. The electronic device of claim 2, wherein the first density is 1/9.

4. The electronic device of claim 2, wherein the second density corresponds to a number of a plurality of green pixels in the second region, and the second density has a value between 0 and 1.

5. The electronic device of claim 4, wherein the second density is twice the first density.

6. The electronic device of claim 1, further comprising a light blocking material provided on at least part of the first region of the display panel.

7. The electronic device of claim 6, wherein the light blocking material comprises at least one of an opaque tape, a white print, or a color print.

8. The electronic device of claim 1, further comprising a light blocking material provided on at least part of the photosensor.

9. The electronic device of claim 8, wherein the light blocking material comprises at least one of an opaque tape, a white print, or a color print.

10. The electronic device of claim 1, wherein the display panel has a display region surrounding the second region, and the black matrix does not have a hole in the display region.

11. The electronic device of claim 1, wherein a size of the first region and a size of the second region are based on a size of the photosensor.

12. A display panel comprising:
    a plurality of color pixels; and
    a black matrix provided between the plurality of color pixels,
    wherein the black matrix has a first plurality of holes having a first density in a first region of the display panel corresponding to a photosensor, and a second plurality of holes having a second density higher than the first density in a second region of the display panel around the first region.

13. The display panel of claim 12, wherein the plurality of color pixels comprise a plurality of green pixels, and the first density corresponds to a number of a plurality of green pixels in the first region, and the first density has a value between 0 and 1.

14. The display panel of claim 13, wherein the first density is 1/9.

15. The display panel of claim 13, wherein the second density corresponds to a number of the plurality of green pixels in the second region, and the second density has a value between 0 and 1.

16. The display panel of claim 15, wherein the second density is twice the first density.

17. The display panel of claim 12, further comprising a light blocking material provided on at least part of the photosensor.

18. The display panel of claim 17, wherein the light blocking material comprises at least one of an opaque tape, a white print, or a color print.

19. The display panel of claim 12, wherein the black matrix does not have a hole in a display region of the display panel surrounding the second region.

20. The display panel of claim 12, wherein a size of the first region and a size of the second region are based on a size of the photosensor.

\* \* \* \* \*